United States Patent
Shank et al.

(10) Patent No.: US 10,192,779 B1
(45) Date of Patent: Jan. 29, 2019

(54) BULK SUBSTRATES WITH A SELF-ALIGNED BURIED POLYCRYSTALLINE LAYER

(71) Applicant: GLOBALFOUNDRIES Inc., Grand Cayman (KY)

(72) Inventors: Steven M. Shank, Jericho, VT (US); Anthony K. Stamper, Williston, VT (US); Ian McCallum-Cook, Burlington, VT (US); Siva P. Adusumilli, South Burlington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/935,606

(22) Filed: Mar. 26, 2018

(51) Int. Cl.
| | |
|---|---|
| *H01L 21/763* | (2006.01) |
| *H01L 29/06* | (2006.01) |
| *H01L 27/12* | (2006.01) |
| *H01L 27/06* | (2006.01) |
| *H01L 21/762* | (2006.01) |
| *H01L 21/324* | (2006.01) |
| *H01L 21/84* | (2006.01) |
| *H01L 21/265* | (2006.01) |
| *H01L 21/02* | (2006.01) |

(52) U.S. Cl.
CPC ...... *H01L 21/763* (2013.01); *H01L 21/26533* (2013.01); *H01L 21/324* (2013.01); *H01L 21/76267* (2013.01); *H01L 21/76283* (2013.01); *H01L 21/84* (2013.01); *H01L 27/0629* (2013.01); *H01L 27/1203* (2013.01); *H01L 29/0642* (2013.01); *H01L 29/0649* (2013.01); *H01L 21/0217* (2013.01); *H01L 21/02164* (2013.01); *H01L 21/02238* (2013.01); *H01L 21/02255* (2013.01); *H01L 21/02271* (2013.01)

(58) Field of Classification Search
CPC .................................................. H01L 21/76267
USPC ........................................................... 257/350
See application file for complete search history.

(56) References Cited

U.S. PATENT DOCUMENTS

| | | | | |
|---|---|---|---|---|
| 4,683,637 | A * | 8/1987 | Varker | H01L 21/26533 438/294 |
| 5,723,896 | A | 3/1998 | Yee et al. | |
| 6,255,145 | B1 * | 7/2001 | Ajmera | H01L 21/266 438/151 |
| 6,333,532 | B1 * | 12/2001 | Davari | H01L 21/266 257/301 |
| 6,429,099 | B1 * | 8/2002 | Christensen | H01L 21/266 438/480 |
| 6,455,903 | B1 * | 9/2002 | Yu | H01L 21/26506 257/391 |
| 6,476,445 | B1 * | 11/2002 | Brown | H01L 21/76232 257/347 |

(Continued)

*Primary Examiner* — Walter H Swanson
(74) *Attorney, Agent, or Firm* — Thompson Hine LLP

(57) ABSTRACT

Structures with altered crystallinity beneath semiconductor devices and methods associated with forming such structures. Trench isolation regions surround an active device region composed of a single-crystal semiconductor material. A non-single-crystal layer has a first section arranged beneath the trench isolation regions and a second section arranged beneath the active device region. The first section of the non-single-crystal layer has a first width in a vertical direction. The second section of the non-single-crystal layer has a second width in the vertical direction that is less than the first width of the first section of the non-single-crystal layer.

12 Claims, 3 Drawing Sheets

(56) References Cited

U.S. PATENT DOCUMENTS

| | | | |
|---|---|---|---|
| 8,299,537 B2 | 10/2012 | Greco et al. | |
| 8,324,031 B2 | 12/2012 | Tan et al. | |
| 2004/0241459 A1* | 12/2004 | Bedell | H01L 21/26506 428/446 |
| 2004/0253793 A1* | 12/2004 | Sasaki | H01L 21/26533 438/404 |
| 2009/0140338 A1* | 6/2009 | Gauthier, Jr. | H01L 21/26533 257/350 |
| 2018/0108675 A1* | 4/2018 | Schmidt | H01L 21/02164 |

* cited by examiner

BULK SUBSTRATES WITH A SELF-ALIGNED BURIED POLYCRYSTALLINE LAYER

BACKGROUND

The present invention relates to semiconductor device fabrication and integrated circuits and, more specifically, to structures with altered crystallinity beneath semiconductor devices and methods associated with forming such structures.

Bulk silicon substrates are less costly than silicon-on-insulator (SOI) substrates. Generally, an SOI substrate includes a thin device layer of silicon, a handle substrate, and a thin buried oxide (BOX) layer, physically separating and electrically isolating the device layer from the handle substrate. Devices fabricated using SOI technologies may exhibit certain performance improvements in comparison with comparable devices built in a bulk silicon substrate. For example, in contrast to an SOI substrate, a bulk silicon substrate is characterized by poor device isolation from harmonic generation.

Improved structures that provide the advantages of an SOI substrate absent the cost and methods of forming such structures are needed.

SUMMARY

In an embodiment of the invention, a structure includes a plurality of trench isolation regions surrounding an active device region composed of a single-crystal semiconductor material, and a non-single-crystal layer having a first section arranged beneath the trench isolation regions and a second section arranged beneath the active device region. The first section of the non-single-crystal layer has a first width in a vertical direction. The second section of the non-single-crystal layer has a second width in the vertical direction that is less than the first width of the first section of the non-single-crystal layer.

In an embodiment of the invention, a method includes forming a plurality of trench isolation regions surrounding an active device region of a substrate, and amorphizing a crystal structure of the active device region and of the substrate beneath the trench isolation regions and the active device region to form amorphized semiconductor material. The method further includes annealing the substrate with an annealing process to convert the amorphized semiconductor material to include a non-single-crystal layer having a first section arranged beneath the trench isolation regions and a second section arranged beneath the active device region. The first section of the non-single-crystal layer has a first width in a vertical direction. The second section of the non-single-crystal layer has a second width in the vertical direction that is less than the first width of the first section of the non-single-crystal layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
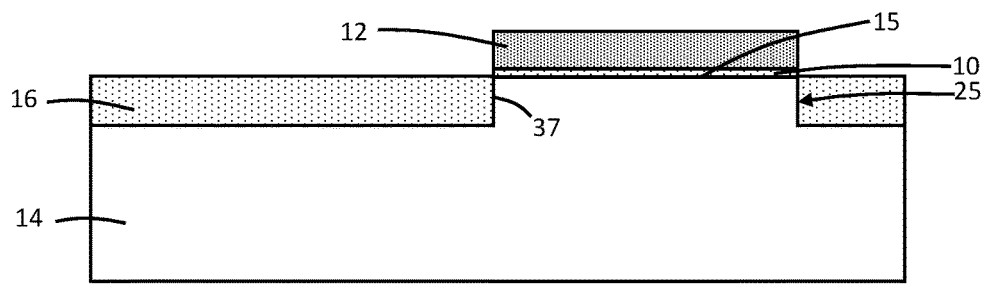
FIGS. 1-4 are cross-sectional views of a structure at successive fabrication stages of a processing method in accordance with embodiments of the invention.

With reference to FIG. 1 and in accordance with embodiments of the invention, pad layers 10, 12 are formed over a top surface 15 of a semiconductor substrate 14. The materials of the pad layers 10, 12 may be chosen to etch selectively to the semiconductor material of the semiconductor substrate 14 and to be readily removed at a subsequent fabrication stage. The pad layers 10, 12 operate as protection layers for the top surface 15 of the semiconductor substrate 14 during, for example, etching processes. The pad layer 10 may be composed of a dielectric material, such as silicon dioxide ($SiO_2$) deposited by chemical vapor deposition (CVD) or formed by thermal oxidation. The pad layer 12 may be composed of a dielectric material, such as silicon nitride ($Si_3N_4$) deposited by chemical vapor deposition (CVD). The semiconductor substrate 14 may be a bulk wafer composed of single-crystal silicon.

Shallow trench isolation regions 16 are formed that extend from the top surface 15 of the semiconductor substrate 14 to a shallow depth beneath the top surface 15 of the semiconductor substrate 14. The shallow trench isolation regions 16 may be composed of a dielectric material, such as an oxide of silicon (e.g., silicon dioxide ($SiO_2$)), deposited by chemical vapor deposition (CVD) into trenches etched by a masked etching process, polished, and deglazed. The shallow trench isolation regions 16 surround an active device region 25 and are coextensive with (i.e., adjoin in direct physical contact) the active device region 25 along a vertical interface 37.

Figure 2:
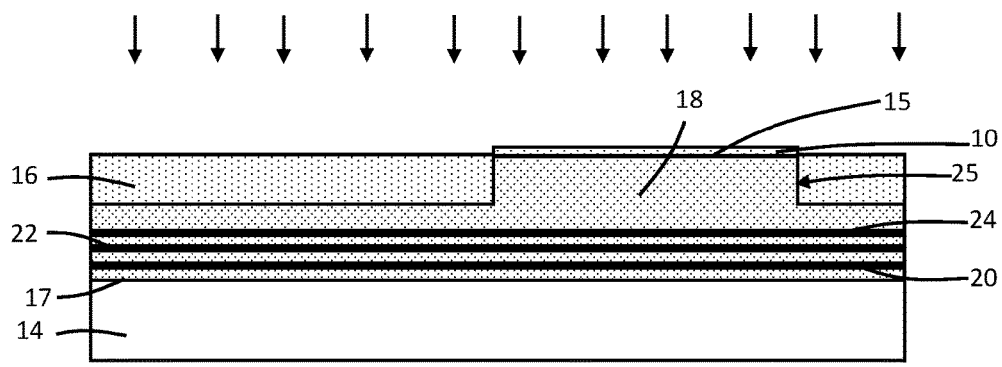

With reference to FIG. 2 in which like reference numerals refer to like features in FIG. 1 and at a subsequent fabrication stage of the processing method, the top pad layer 12 is removed, and a series of ion implantations (i.e., chained implants) is performed to form a modified layer 18 in the semiconductor substrate 14. The modified layer 18 extends from the top surface 15 of the semiconductor substrate 14 at the pad layer 10 to a given depth, d, into the semiconductor substrate 14 beneath the top surface 15 and follows the contours of the shallow trench isolation regions 16. A portion of the semiconductor substrate 14 beneath the modified layer 18 is arranged beyond the depth profile of the implanted ions, and may receive negligible damage during the ion implantations and remain single crystal. The modified region 18 may be considered to have a lower boundary 17 with the underlying single-crystal portion of the semiconductor substrate 14.

Each of the ion implantations performed to form the modified layer 18 introduces energetic ions, as indicated diagrammatically by the single-headed arrows, with ion trajectories that penetrate through the pad layer 10 and shallow trench isolation regions 16 and that stop in the semiconductor material of the semiconductor substrate 14. The energetic ions, as they penetrate through the pad layer 10 and shallow trench isolation regions 16 and into the underlying sections of the semiconductor substrate 14, lose energy via scattering events with atoms and electrons in the constituent materials. Energy lost in nuclear collisions, which dominates at low kinetic energies after energy loss, displaces target atoms of the semiconductor substrate 14 from their original lattice sites, which damages the crystal lattice structure of the semiconductor substrate 14 and generates point defects.

The ions may be generated from a suitable source gas and implanted into the semiconductor substrate 14 with selected implantation conditions using an ion implantation tool. The conditions (e.g., ion species, dose, kinetic energy) of each implantation may be selected to tune the characteristics (e.g., depth profile and amount of damage) of the modified layer 18. In particular, each implantation introduces ions at a different kinetic energy and with a different dose to provide a depth profile of stopped ion concentration and a related depth profile of damage to the crystal lattice that are each parameterized by a projected range and a range straggle. The crystal lattice structure of the semiconductor substrate 14 may be amorphized over the depth range of the modified layer 18 relative to its initial single-crystal state by the damage induced by the implanted ions. In an embodiment, the ion species of the ions that are implanted to form the modified layer 18 may be generated from argon (Ar) or another type of inert source gas. Knock-on atoms (e.g., oxygen atoms) of the pad layer 10, which are subjected to a kinematic impact from the ions, may be energetically driven to a shallow depth into the underlying semiconductor material of the semiconductor substrate 14.

In an embodiment, the multiple implantations may include three (3) or more distinct implantations of different kinetic energies and doses in which the same ion species may be used. In the representative embodiment, three (3) implantations are performed to correspondingly provide bands or regions 20, 22, 24 of peak ion dose and/or damage in which each of the regions 20, 22, 24 is correlated with one of the implantations. In an embodiment, the central region 22 may receive a dose of implanted ions that is greater than the dose of implanted ions in either the upper region 24 or the lower region 20. A single ion implantation at a single kinetic energy is not adequate to provide the desired isolation effect while maintaining the ability to recrystallize the semiconductor substrate 14 to single-crystal near the pad layer 10.

In an alternative embodiment, the implantations forming the modified layer 18 may be performed before the shallow trench isolation regions 16 are formed.

Figure 3:
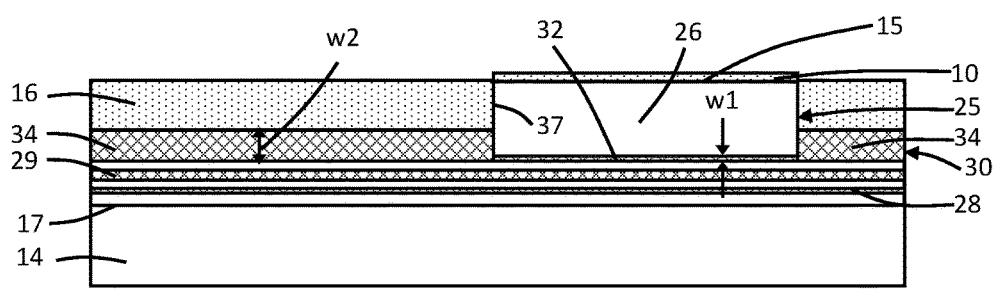

With reference to FIG. 3 in which like reference numerals refer to like features in FIG. 2 and at a subsequent fabrication stage of the processing method, the modified layer 18 is subjected to one or more thermal treatments (i.e., anneals) that convert the modified layer 18 to a single-crystal layer 26 and multiple non-single-crystal layers 28, 29, 30. The non-single-crystal layers 28, 29, 30 are interspersed or arranged in the single-crystal layer 26 with a vertically spaced or stacked relationship. In an embodiment, a spike anneal may be performed as the thermal treatment used to convert the modified layer 18. In an embodiment, the spike anneal may be a rapid thermal anneal (RTA) performed using, for example, a bank of flash lamps that heat the modified region 18 to a peak temperature in a range of 950° C. to 1050° C. with a dwell time at the peak temperature of 30 milliseconds to 1 second.

The thermal treatment recrystallizes the amorphized semiconductor material of the modified region 18 into a combination of single-crystal semiconductor material (e.g., single-crystal silicon) and polycrystalline semiconductor material (e.g., polysilicon). In particular, the thermal process repairs or heals the damage to (i.e., recrystallize or regrow) the semiconductor material of the modified layer 18 and thereby convert the modified layer 18 to the single-crystal layer 26 and the non-single-crystal layers 28, 29, 30. The semiconductor material of the semiconductor substrate 14, which is arranged beneath the lower boundary 17 with the modified region 18, provides the crystalline template for regrowth (i.e., recrystallization). The single-crystal layer 26 is composed of single-crystal semiconductor material, and the non-single-crystal layers 28, 29, 30 may be composed of polycrystalline semiconductor material and, in an embodiment, may contain residual damage (e.g., defects) in addition to the grains of the polycrystalline semiconductor material.

A section of the single-crystal semiconductor material of the single-crystal layer 26 is arranged in the vertical direction between the non-single-crystal layer 28 and the non-single-crystal layer 29, and another section of the single-crystal semiconductor material of the single-crystal layer 26 is arranged in the vertical direction between the non-single-crystal layer 29 and the non-single-crystal layer 30. A section of the single-crystal layer 26 is also arranged in the vertical direction between the non-single-crystal layer 28 and the lower boundary 17.

The active device region 25 is constituted by a section of the single-crystal layer 26 that is surrounded by the shallow trench isolation regions 16. The non-single-crystal layer 30 includes a section 32 that is arranged below the active device region 25 and a section 34 that is arranged beneath the shallow trench isolation regions 16. The sections 32 and 34 of the non-single-crystal layer 30 are continuous and adjoined beneath the active device region 25 and the shallow trench isolation regions 16. The active device region 25 is arranged directly above sections of the non-single-crystal layers 28, 29 and the section 32 of the non-single-crystal layer 30 such that multiple sections of polycrystalline semiconductor material are disposed under the active device region 25. These multiple sections of polycrystalline semiconductor material may improve linearity and reduce leakage of device structures fabricated using the active device region 25.

The non-single-crystal layers 28, 29 and the section 32 of non-single-crystal layer 30 are arranged at or near the former locations of the regions 20, 22, 24 of peak ion dose and/or damage in the semiconductor material of the modified layer 18. The non-single-crystal layer 29, which is the product of the region 22 implanted with the highest ion dose, has a width in the vertical direction that that is greater than the width of the non-single-crystal layer 28 produced from region 20 or the width of the section 32 of the non-single-crystal layer 30 produced from region 24.

The section 34 of the non-single-crystal layer 30 is formed in a self-aligned manner due to the proximity in a vertical direction of the shallow trench isolation regions 16 to a section of the upper region 24 of peak ion dose and/or damage in the semiconductor material of the modified layer 18. Due to the proximity of the shallow trench isolation regions 16, the section 34 of the non-single-crystal layer 30 may have a width, w2, in a vertical direction that is greater than the width, w1, of the section 32 of the non-single-crystal layer 30 beneath the active device region 25. In comparison with the shallow trench isolation regions 16, the pad layer 10 has a lesser degree of proximity of the pad layer 10 to the nearest region 24 of peak ion dose and/or damage in the semiconductor material of the modified layer 18 and does not influence recrystallization in the active device region 25. The transition between the sections 32 and 34 of different width occurs in alignment with the vertical interface 37 between the active device region 25 and the shallow trench isolation regions 16. The section 34 of the non-singlecrystal layer 30 surrounds the active device region 25 at a depth in the semiconductor substrate 14 arranged beneath the shallow trench isolation regions 16 and may be in direct physical contact with the dielectric material of the shallow trench isolation regions 16. These multiple sections of polycrystalline semiconductor material may improve linearity and reduce leakage of passive device structures fabricated over the shallow trench isolation regions 16.

In an embodiment, the multiple implantations may be all performed before the thermal treatment. In an embodiment, an individual thermal treatment may be performed after each of the multiple implantations in a sequence of implant, anneal, implant, anneal, implant, anneal. In other embodiments, different combinations of implant and anneal may be applied to form the single-crystal layer 26 and non-single-crystal layers 28, 29, 30.

Figure 4:
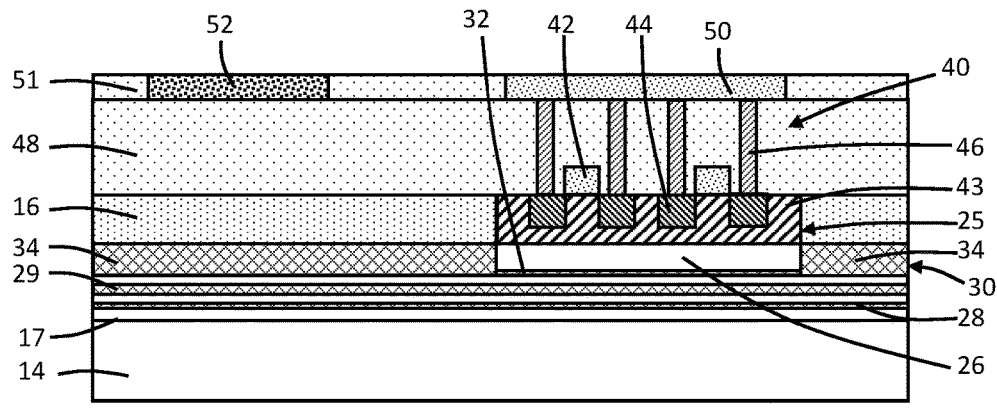

With reference to FIG. 4 in which like reference numerals refer to like features in FIG. 3 and at a subsequent fabrication stage of the processing method, a device structure, generally indicated by reference numeral 40, may be formed by front-end-of-line (FEOL) processing using the device region of the semiconductor substrate 14 that is surrounded by the shallow trench isolation regions 16. For example, the device structure 40 may be a field-effect transistor that includes one or more gate fingers composed of a gate electrode 42 and a gate dielectric formed by depositing a layer stack and patterning the layer stack with photolithography and etching. The gate electrode 42 may be composed of a conductor, such as doped polycrystalline silicon (i.e., polysilicon), and the gate dielectric may be composed of an electrical insulator, such as silicon dioxide ($SiO_2$). The field-effect transistor providing the device structure 40 in the representative embodiment may include other elements such as a well 43 of a given conductivity type and source/drain regions 44 of opposite conductivity type in the well 43, as well as silicide on the source/drain regions 44, halo regions, lightly doped drain (LDD) extensions, and non-conductive sidewall spacers on each gate finger.

Middle-of-line (MOL) processing and back-end-of-line (BEOL) processing follow, which includes formation of contacts, vias, and wiring for an interconnect structure coupled with the device structure 40. The interconnect structure may include contacts 46 in a dielectric layer 48 and a wire 50 in one or more dielectric layers 51 over the dielectric layer 48. The wire 50 is coupled by the contacts 46 with the device structure 40 and, in the representative embodiment, with the source/drain regions 44. A passive device 52, such as a diode, a resistor, a capacitor, a varactor, a waveguide, or an inductor, may also be formed on the dielectric layer 48 and, in particular, may be formed over one of the shallow trench isolation regions 16. For example, the passive device 52 may be a metal-insulator-metal capacitor formed by depositing and patterning layers of its constituent materials.

Figure 5:
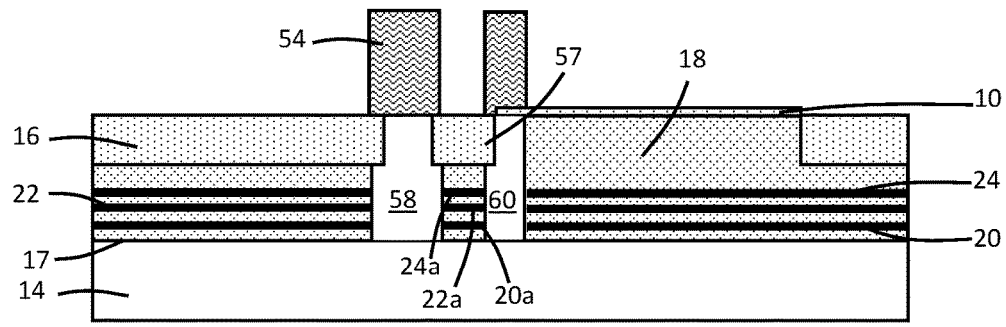
FIGS. 5-7 are cross-sectional views of a structure at successive fabrication stages of a processing method in accordance with alternative embodiments of the invention.

With reference to FIG. 5 in which like reference numerals refer to like features in FIG. 1 and in accordance with alternative embodiments of the invention, a mask 54 may be formed by lithography over the pad layer 10 before performing the ion implantations. The mask 54 may include a layer of a light-sensitive material, such as an organic photoresist, applied by a spin coating process, pre-baked, exposed to light projected through a photomask, baked after exposure, and developed with a chemical developer. The thickness of the mask 54 is selected such that the ions being implanted are stopped in the mask 54 instead of penetrating into the underlying semiconductor substrate 14. The shallow trench isolation regions 16 may be modified to add a section 57. A section of the mask 54 masks the single-crystal section 58 of the semiconductor substrate 14. Another section of the mask 54 overlaps with the section 57 of the shallow trench isolation regions 16 and the active device region 25.

Due to ion stopping within the thickness of the mask 54, masked sections 58, 60 of the semiconductor substrate 14 are not implanted and remain intact as undamaged single-crystal semiconductor material. These single-crystal sections 58, 60 of the semiconductor substrate 14 introduce discontinuities into the regions 20, 22, 24 of peak ion dose and/or damage. Disconnected sections 20a, 22a, 24a of the regions 20, 22, 24 of peak ion dose and/or damage are arranged between the single-crystal sections 58, 60 of the semiconductor substrate 14.

Figure 6:
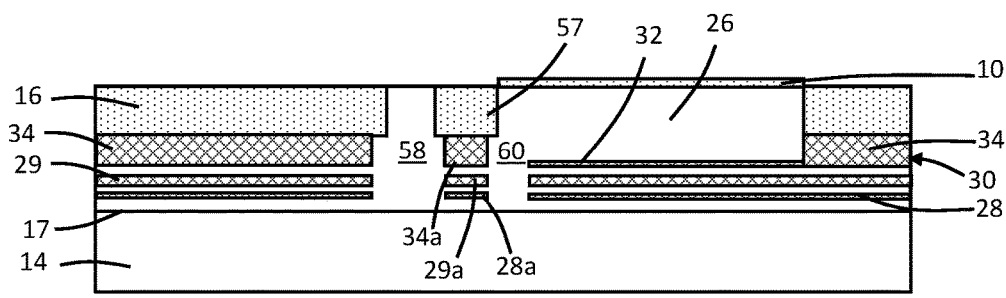

With reference to FIG. 6 in which like reference numerals refer to like features in FIG. 5 and at a subsequent fabrication stage of the processing method, the single-crystal layer 26 and non-single-crystal layers 28, 29, 30 are formed as described in the context of FIG. 3. The single-crystal sections 58, 60 merge with, and are included within, the single-crystal layer 26. The non-single-crystal layers 28, 29 and the section 34 of the non-single-crystal layer 30 include respective disconnected sections 28a, 29a, 34a that are arranged directly beneath the section 57 of the shallow trench isolation regions 16 in a vertical direction and laterally between the single-crystal sections 58, 60.

Figure 7:
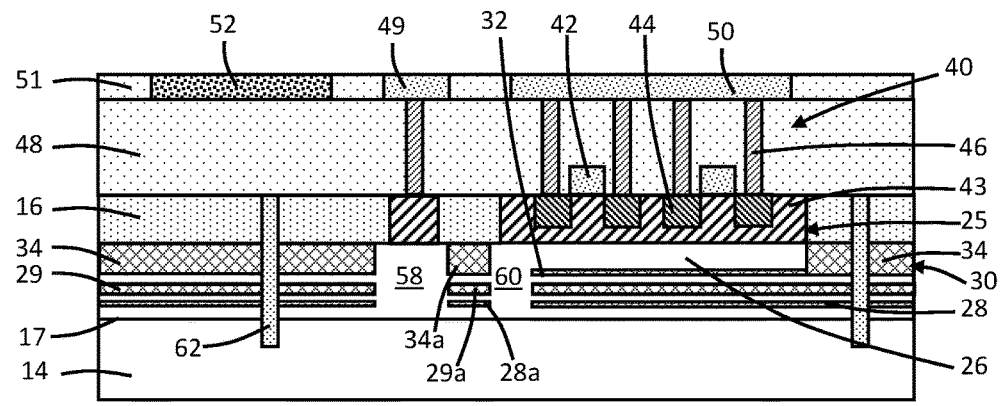

With reference to FIG. 7 in which like reference numerals refer to like features in FIG. 6 and at a subsequent fabrication stage of the processing method, processing may continue as described in connection with FIG. 4 to form the device structure 40 and other features. A wire 49 may be coupled by one of the contacts 46 with the single-crystal section 58, which provides a body contact region. An upper portion of the single-crystal section 58 may be doped when the well 43 is formed and may have the same conductivity type as the well 43.

In an alternative embodiment, deep trench isolation regions 62 may be formed during FEOL processing that interrupt the continuity of the non-single-crystal layers 28, 29, and the section 34 of the non-single-crystal layer 30. The deep trench isolation regions 62 may be formed by etching deep trenches into the semiconductor substrate 14 and filling the deep trenches with a dielectric material, such as an oxide of silicon (e.g., $SiO_2$) deposited by CVD and planarized with CMP.

Figure 8:
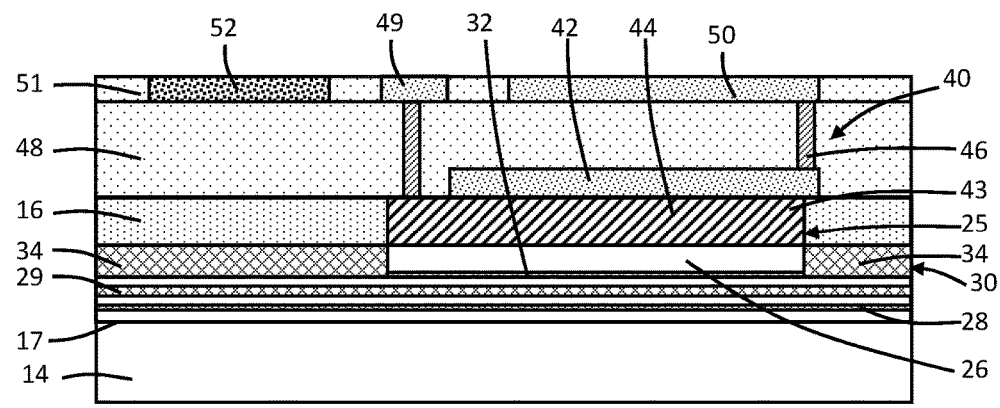
FIG. 8 is a cross-sectional view of a structure similar to the structure of FIG. 4 and in accordance with alternative embodiments of the invention.

With reference to FIG. 8 in which like reference numerals refer to like features in FIG. 4 and in accordance with alternative embodiments of the invention, the wire 49 (FIG. 7) may be directly connected by one of the contacts 46 with the well 43 to provide a body contact that may be used to apply a bias to the active device region 25.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a plurality of trench isolation regions surrounding an active device region composed of a single-crystal semiconductor material; and
   a first non-single-crystal layer having a first section arranged beneath the trench isolation regions and a second section arranged beneath the active device region,
   wherein the first section of the first non-single-crystal layer has a first width in a vertical direction, and the second section of the first non-single-crystal layer has a second width in the vertical direction that is less than the first width of the first section of the first non-single-crystal layer.

2. The structure of claim 1 wherein the first section of the first non-single-crystal layer is in direct physical contact with the trench isolation regions.

3. The structure of claim 2 wherein the plurality of trench isolation regions and the active device region converge along a vertical interface, and the first section of the first non-single-crystal layer and the second section of the first non-single-crystal layer converge in alignment with the vertical interface.

4. The structure of claim 1 wherein the plurality of trench isolation regions and the active device region converge along a vertical interface, and the first section of the first non-single-crystal layer and the second section of the first non-single-crystal layer converge in alignment with the vertical interface.

5. The structure of claim 1 further comprising:
   a second non-single-crystal layer arranged in the vertical direction beneath the first section of the first non-single-crystal layer and the second section of the first non-single-crystal layer,
   wherein the first non-single-crystal layer and the second non-single-crystal layer are separated by a first section of single-crystal semiconductor material.

6. The structure of claim 5 further comprising:
   a third non-single-crystal layer arranged in the vertical direction beneath the first section of the first non-single-crystal layer and the second section of the first non-single-crystal layer,
   wherein the second non-single-crystal layer is arranged between the first non-single-crystal layer and the third non-single-crystal layer, and the third non-single-crystal layer and the second non-single-crystal layer are separated by a second section of single-crystal semiconductor material.

7. The structure of claim 1 further comprising:
   a field-effect transistor including a gate structure arranged on the active device region and a source/drain region arranged in the active device region.

8. The structure of claim 7 further comprising:
   an interlayer dielectric layer arranged over the active device region and the trench isolation regions;
   a contact extending vertically through the interlayer dielectric layer to the field-effect transistor; and
   a passive device arranged on the interlayer dielectric layer over the first section of the first non-single-crystal layer.

9. The structure of claim 1 further comprising:
   a body contact region separated from the active device region by one or more of the plurality of trench isolation regions,
   wherein the first non-single-crystal layer includes a third section having the first width that is arranged beneath the body contact region, the third section of the first non-single-crystal layer is separated from the first section of the first non-single-crystal layer by a first section of single crystal semiconductor material, and the third section of the first non-single-crystal layer is separated from the second section of the first non-single-crystal layer by a second section of single crystal semiconductor material.

10. The structure of claim 9 further comprising:
    a deep trench isolation region arranged to extend through the first section of the first non-single-crystal layer.

11. The structure of claim 1 wherein the first section of the first non-single-crystal layer surrounds the active device region.

12. The structure of claim 1 wherein the first section of the first non-single-crystal layer and the second section of the first non-single-crystal layer each include polycrystalline semiconductor material.

* * * * *